April 26, 1966 R. F. RUTZ 3,248,614

FORMATION OF SMALL AREA JUNCTION DEVICES

Filed Nov. 15, 1961

INVENTOR
RICHARD F. RUTZ

BY John F. Ohlandt Jr.

ATTORNEY

3,248,614
FORMATION OF SMALL AREA JUNCTION DEVICES

Richard F. Rutz, Cold Spring, N.Y., assignor to International Business Machines Corporation, New York, N.Y., a corporation of New York Filed Nov. 15, 1961, Ser. No. 152,400
9 Claims. (Cl. 317—234)

Figure 1:
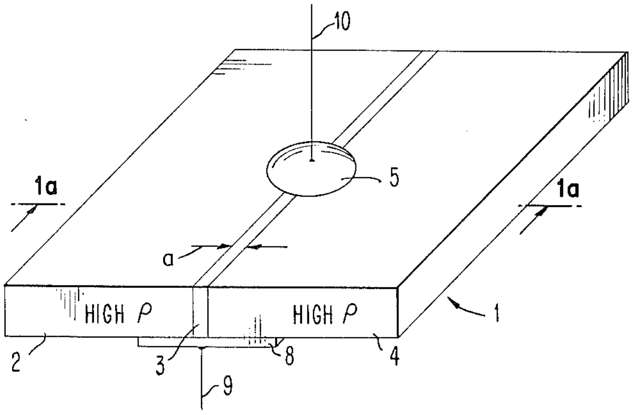

This invention relates to the formation of semiconductor devices and, more particularly, to the formation of junction devices, especially those that have come to be known in the semiconductor art as tunnel diodes.

The tunnel diode is a unique semiconductor device whose operation depends upon the phenomenon of quantum mechanical tunneling and has been described in the literature by L. Esaki in the Physical Review, vol. 109, January 1958. This device includes a P-N junction defined by two regions of semiconductor material of very high conductivity. The conductivity of the regions is such that one region is degenerated and the other region approaches degeneracy so that under zero bias conditions, the conduction band on one side of the junction overlaps the valence band on the other side of the junction. Degeneracy may be defined as an impurity concentration sufficient to cause the Fermi level to rise within the valence or conduction band. Such impurity concentration is on the order of $10^{19}$ atoms/cc. and higher. Since the phenomenon of quantum mechanical tunneling is an electron-wave function which decreases rapidly with distance, it is necessary that the P-N junction, that is, the transition distance in the crystal from the high conductivity of one type through the space charge layer to the high conductivity of the opposite type, be very small. For germanium this distance is on the order of 150 angstrom units or less. The voltage-current characteristic exhibited by a device that meets the criteria set forth above has two regions of positive resistance at low and high values of voltage and a transitional negative resistance region at intermediate values of voltage between the two positive resistance regions.

Because of its many valuable attributes, such as negative resistance, ability to withstand high temperatures, insensitivity to radiation, etc., the tunnel diode has come to the forefront of important new devices that are particularly useful for switching applications in computers.

An important criterion or figure of merit that has become established for the tunnel diode is the $I_p/C$ ratio, where $I_p$ represents the peak current that is present just before the voltage-current characteristic curve exhibits negative resistance, and where C represents the capacitance of the diode. When it is desired to operate the tunnel diode in circuits at very high speeds and with low power dissipation, a necessary condition imposed is that the peak current be small. In order to satisfy this imposed condition, it is necessary that the junction area be made very small. For example, for operation at very high speeds and with a low peak current, the junction area of a tunnel diode must be on the order of 0.10 $mil^2$ and less. As will be apparent, with the use of conventional fabrication techniques, this involves forming a structure that is extremely fragile mechanically.

Accordingly, it is a primary object of the present invention to enable the formation of a tunnel diode which has a very small junction area and yet one which is mechanically stable.

It is another object of the present invention to allow for the formation of a very small junction area but with a very limited portion of the total perimeter of the junction exposed at the top surface of the crystal, thereby to reduce surface leakage effects.

Yet another object is to achieve reproducibility by virtue of the ability to "trim" the junction area down to the requisite size to produce a desired peak current but without significantly increasing the portion of the total perimeter of the junction that is exposed at the top surface of the crystal.

The above objects are attained in accordance with the present invention by embedding the degenerate P-N junction in a high resistivity, semiconductor structure comprising an integral crystalline body. In one specific embodiment, the embedding of such a junction is achieved by forming a very thin layer or wall of degenerate semiconductor material between two relatively thick, high resistivity supporting layers and thereafter by overlaying one surface of the entire structure thus formed with an impurity dot suitably doped so as to create a recrystallized opposite conductivity region within the semiconductor structure in contact with the originally formed degenerate layer and with the supporting layers. The contact of the recrystallized region with the originally formed degenerate layer establishes the tunnel diode P-N junction.

The foregoing and other objects, features and advantages of the invention will be apparent from the following more particular description of a preferred embodiment of the invention, as illustrated in the accompanying drawings.

In the drawings:

FIG. 1 is a perspective view of one embodiment of the device formed in accordance with the teaching of the present invention.

Figure 1A:
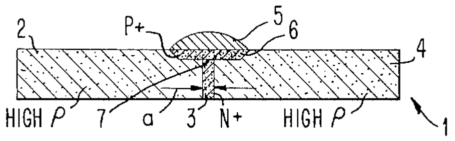

FIG. 1*a* is a front view in section of the device of FIG. 1.

Figure 1B:
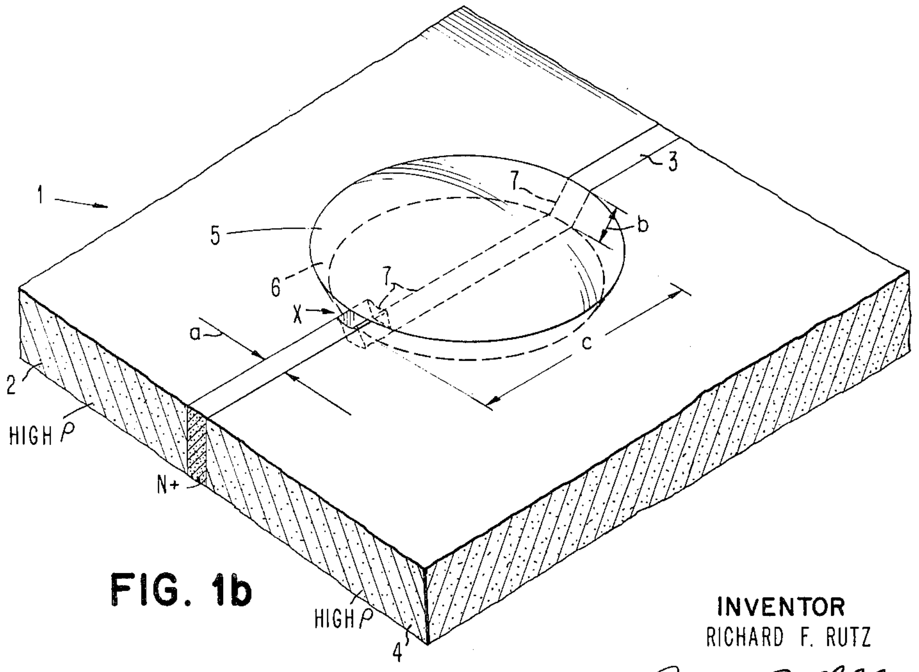

FIG. 1*b* is an enlarged isometric view of a part of the device of FIG. 1 illustrating the extent of the junction.

Figure 2:
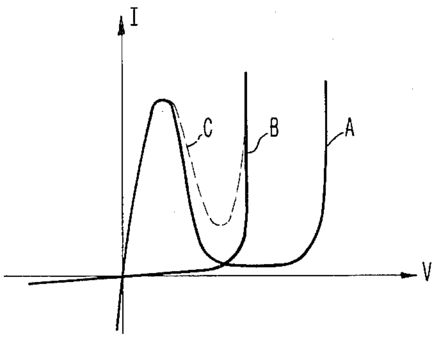

FIG. 2 is a plot of the V–I characteristic of the tunnel diode junction, the parallel semiconductor junction and the composite V–I characteristic of both of the aforesaid devices taken together.

Referring now to FIGS. 1, 1*a* and 1*b*, there is illustrated a semiconductor structure 1 constituted of a first region 2 of high resistivity semiconductor material, for example, germanium. What is meant by high resistivity is that the material is either intrinsic or substantially intrinsic. In the latter case, it may be slightly n- or p-type. Numerically, such high resistivity for germanium would be on the order of 50 ohm-cm. Region 3 in the structure of FIG. 1 is a degenerate n-conductivity-type region formed, for example, by a short-diffusion of arsenic, into an original semiconductor wafer of high resistivity; then, by lapping, all degenerate material, except the thin region 3 within the crystal, is removed. Of course, region 3 could also be similarly formed by other techniques well known in the art, such as by vapor growth of this region onto an original wafer. It will be appreciated that region 3 need not have parallel surfaces, as is indicated by FIG. 1, but may be irregularly shaped, particularly for the case where it is desired that the junction area be small and yet the internal resistance be kept to a very low value. Region 4, like region 2, is of high resistivity and is formed by vapor growth of the material onto the middle region 3.

Alternatively, the entire configuration of FIG. 1 can be formed in a single original wafer of high resistivity material by preferentially diffusing an impurity into an originally intrinsic region, such as region 3. For instance, this can be performed if dislocations or a grain boundary exists in a thin region of the parent crystal. In this case, after diffusion of the impurity, the top of the wafer would be lapped off to the depth of the diffusion in the dislocation free part of the wafer.

Thus it may be seen that the structure of FIG. 1*a* is constituted of an active, degenerately doped, region embedded between two relatively thick, high resistivity, regions which serve as support for the active region 3. After formation of the initial structure comprising regions 2, 3 and 4, region 6 is now formed so as to be a degenerate p-type region. This region is formed, for example, by an alloying technique whereby an impurity dot labelled 5 is placed on the top surface of the composite structure of FIG. 1 and is heated, typically for germanium to approximately 500° C., whereby a portion of the top surface is dissolved and upon recrystallization, due to cooling down of the entire assembly, the acceptor doped region 6 will be produced. This region is degenerately doped p-type because of the high concentration of the impurity, for example, gallium, used in the dot 5.

It will be noted that the tunnel diode device now formed, that is, the active part of the structure of FIG. 1, is constituted of region 3 and of those portions of region 6 which are in contact with region 3. Region 3 is degenerately doped n-type and, hence, is labelled $N^+$ in the figures, whereas region 6 is degenerately doped p-type and, hence, labelled $P^+$ in the figures. The total extent of the P–N tunnel junction 7 that has been formed will be appreciated by reference to FIG. 1*b* wherein the bevelled portion labelled *b* represents the extent of the junction 7 in depth by reason of the penetration of region 6 into the crystal body and the portion *c* represents the length of the junction parallel to the top surface. Thus, as may also be readily seen by reference to FIG. 1*b*, the total area of the junction is given by the formula $\text{Area}=a(c+2b)$, and the total $\text{Perimeter}=2a+2c+4b$. It will be understood, of course, that the various figures have not been drawn to scale and, in particular, that FIG. 1*b* has been greatly enlarged. However, one can appreciate that, for the type of construction that is involved in accordance with the technique of the present invention, what is realized is a very narrow strip for the junction; in other words, it has one large dimension and one very small dimension. By reason of this type of construction, it can be seen that when an etching step is performed for trimming or tailoring the junction area in order to obtain thereby a desired value of peak current, there will be only an insignificant change in the fraction of the junction perimeter that is exposed to the atmosphere and, hence, a very limited fraction of the total perimeter exists wherein deleterious surface leakage effects can take place. For example, if in connection with FIGS. 1*a* and 1*b*, the value of the long dimension, that is, $2b+c$, were on the order of 2 mils, $(c>>>b)$, and the short dimension *a*, which is equal to the width of the degenerate layer 3, were on the order of .05 mil, the total area would be approximately .10 $\text{mil.}^2$. In FIG. 1*b*, there is shown at the point indicated by X in that figure, the removal of a small amount of material by etching. This etching step would be continued until a desired value of peak current was obtained and, as may be seen from FIG. 1*b*, this would represent a very slight change for the ratio of junction perimeter exposed to total junction perimeter.

Referring now to FIG. 2, the V–I characteristic labelled A in this figure is the tunnel diode characteristic, as is well known to those skilled in the art. From what has been said heretofore, it will be evident that this characteristic is for just that part of the structure of FIG. 1 constituted of the region labelled 3 and that portion of the region 6 contacting region 3. The exemplary V–I characteristic labelled B in FIG. 2 is what may be referred to as a conventional diode characteristic and is the V–I characteristic for that part of the structure of FIG. 1 which surrounds the active tunnel diode. This part of the structure is made up of portions of region 6 and the portions of regions 2 and 4 contiguous region 6. Curve C in FIG. 2 is a plot of the composite characteristic that results by virtue of the paralleling of the tunnel diode with the conventional diode due to the affixing of electrical contacts to the structure of FIG. 1. Thus, as may be seen in FIG. 1, a broad area ohmic contact labelled 8 is made to overlay the two high resistivity regions 2 and 4 as well as the active region 3. A conductor 9 is fused to the broad area contact 8 and an electrical conductor 10 is connected to the opposite surface of the structure.

Other V–I characteristics can, of course, be realized for the part of the structure of FIG. 1 which surrounds the tunnel diode. For example, the V–I characteristic labelled B in FIG. 2 can be varied in such a way that the position of the second positive resistance region, which occurs at higher values of voltage, can be shifted. These different V–I characteristics may be achieved due to the dependence of the characteristic on the resistivity and the lifetime of carriers in the supporting layers.

It will be apparent to those versed in the art that other methods can be used to form the structure and that the principles disclosed herein are not limited to particular materials, such as germanium but may be applied to all suitable semiconductor materials. Thus, for example, a material such as gallium arsenide could likewise be used in forming part or all of the structure of FIG. 1. Additionally, if desired, an alloy or mixture of several materials, such as of gallium arsenide and germanium, could be employed in the configuration of FIG. 1.

A modification of the structure of FIG. 1 may be made such that two or more degenerate layers or walls of semiconductor material are embedded between contiguous high resistivity regions. Thus, for example, a series connection of two tunnel diodes may be realized by providing that the degenerate layers be of opposite conductivity-type, and corresponding opposite conductivity alloy contacts be made on one surface to the respective layers. Thereafter the two degenerate layers would be linked together on the opposite surface by an ohmic film or strip and separate conductors thereafter attached to each of the alloy contacts on the degenerate layers. Such an integrated circuit package would be useful in "twin diode" logical schemes that have been proposed.

Although the technique of the present invention has been explained in connection with a particularly serious problem that exists in the formation of tunnel diode structures, it will be obvious to the skilled worker that the present technique may be applied successfully to the formation of other nontunneling diodes where the requirement of small area junctions is of paramount importance.

What has been disclosed is a novel structure and a technique for forming this structure, whereby a tunnel diode may be operated at very high speeds and at low peak currents because of the small junction area that is produced. The novel structure enables high-speed operation, but at the same time, provides good mechanical stability.

In addition to the mechanical stability that is gained by the structure of the present invention, additional advantages are that the structure lends itself to integrated circuit fabrication and provides reduction in the amount of P-N junction that is exposed to the surface and, hence, reduces surface leakage effects. Further, the thickness of the active area, that is, the degenerate wall, may vary for different units and yet, the technique of the present invention permits matching of diode characteristics by reason of control of the junction area without significantly affecting the fraction of junction perimeter which is exposed.

While the invention has been particularly shown and described with reference to a preferred embodiment thereof, it will be understood by those skilled in the art that various changes in form and details may be made therein without departing from the spirit and scope of the invention.

What is claimed is:

1. A semiconductor structure comprising an integral crystalline body having a thin region of predetermined conductivity-type semiconductor material interposed two contiguous regions of high resistivity semiconductor material, which two regions serve as support for said thin region; a further region of semiconductor material, contiguous one surface of said crystalline body in contact with said thin region and said two supporting regions and defining with said thin region a non-ohmically conductive junction device, the junction area thus formed being determined by the width of said thin region and the fraction of junction perimeter that is exposed being determined by the width of said thin region.

2. A semiconductor structure comprising an integral crystalline body having a thin region of predetermined conductivity-type semiconductor material interposed two contiguous regions of high resistivity semiconductor material, which two regions serve as support for said thin region; a further region of semiconductor material, contiguous one surface of said crystalline body in contact with said thin region and said two supporting regions and defining with said thin region a non-ohmically conductive junction device, the junction area thus formed being determined by the width of said thin region so that said junction area is very small.

3. A semiconductor structure comprising an integral crystalline body having a thin region of predetermined conductivity-type semiconductor material situated between two contiguous regions of high resistivity semiconductor material, which two regions serve as support for said thin region; a further region of opposite conductivity-type semiconductor material contiguous one surface of said crystalline body in contact with said thin region and said two support regions and defining with said thin region a P-N junction device.

4. A semiconductor structure comprising an integral crystalline body having a thin region of degenerately doped semiconductor material disposed between two contiguous regions of high resistivity semiconductor material, which two regions serve as support for said thin region; a further region of degenerately doped semiconductor material within said crystalline body in contact with said thin region and said two support regions and defining with said thin region a tunneling junction device, the area of the junction thus formed being determined by the width of said thin region and the fraction of junction perimeter that is exposed being limited by said thin region to a small amount.

5. The invention as defined in claim 4 wherein the width of said thin region is on the order of 0.05 mil and said junction area is on the order of 0.10 $mil^2$.

6. A semiconductor structure comprising an integral crystalline body having a thin region of degenerately doped, n-conductivity-type, semiconductor material disposed between two contiguous regions of high resistivity semiconductor material which two regions serve as support for said thin region; an alloy region of degenerately doped, p-conductivity-type, semiconductor material in contact with said thin region and said two support regions and defining with said thin region a P-N tunneling junction device.

7. A semiconductor device comprising an integral crystalline body having a thin region of n-conductivity-type semiconductor material disposed between two contiguous support regions of high resisitivity semiconductor material; an alloyed rectifying contact on one surface of said crystalline body including a further region of p-conductivity-type semiconductor material in contact with said region and said two supporting regions and defining with said thin region a P-N junction device; an ohmic contact to the opposite surface of said body and electrical conductors affixed to said alloyed contact and said ohmic contact.

8. A method of forming a semiconductor junction device so as to permit a simple adjustment of the value of peak current for said device without affecting the fraction of junction perimeter that is exposed to the surface of a crystalline body, comprising the steps of forming an integral crystalline body having a thin region of predetermined conductivity-type semiconductor material situated between two contiguous regions of high resistivity semiconductor material; overlaying said thin region and said two contiguous regions of higher resistivity with a further region of semiconductor material which defines with said thin region a non-ohmically conductive junction device; adjusting the area of the junction so defined by etching away a portion of said thin region in contact with said further region.

9. A method of forming a semiconductor junction device so as to permit a simple adjustment of the value of peak current for said device without affecting the fraction of junction perimeter that is exposed to the surface of a crystalline body comprising the steps of, forming an integral body having a thin region of predetermined conductivity-type semiconductor material situated between two contiguous regions of high resistivity semiconductor material; placing an alloy impurity dot in contact with one surface of said crystalline body so as to overlay said thin region and said two contiguous regions of high resistivity; heating the entire assembly thus formed and thereafter cooling down said assembly to produce within said integral crystalline body an alloy region of opposite conductivity-type semiconductor material in contact with said thin region and said two contiguous regions and defining with said thin region a non-ohmically conductive junction; adjusting the area of the junction defined by said thin region by etching away a portion of said thin region in contact with said alloy region.

References Cited by the Examiner

UNITED STATES PATENTS

| | | | |
|---|---|---|---|
| 2,777,101 | 1/1957 | Cohen | 317—235 |
| 3,034,079 | 5/1962 | Uhlir | 317—235 |
| 3,110,849 | 10/1963 | Soltys | 317—234 |

OTHER REFERENCES

IBM Technical Disclosure Bulletin, "Etching PN Junctions," vol. 2, No. 3, October 1959.

JOHN W. HUCKERT, *Primary Examiner.*

JAMES KALLAM, *Examiner.*

L. ZALMAN, *Assistant Examiner.*